United States Patent
Zanardi et al.

(10) Patent No.: US 8,045,310 B2
(45) Date of Patent: Oct. 25, 2011

(54) SEMICONDUCTOR DEVICE WITH OVERCURRENT PROTECTION

(75) Inventors: Alberto Zanardi, Villach (AT); Erich Scheikl, Villach (AT); Robert Illing, Villach (AT); Herbert Hopfgartner, Lieserbruecke (AT)

(73) Assignee: Infineon Technologies AG, Neubiberg (DE)

( * ) Notice: Subject to any disclaimer, the term of this patent is extended or adjusted under 35 U.S.C. 154(b) by 22 days.

(21) Appl. No.: 12/649,974

(22) Filed: Dec. 30, 2009

(65) Prior Publication Data

US 2011/0157756 A1    Jun. 30, 2011

(51) Int. Cl.
 *H02H 9/02* (2006.01)
(52) U.S. Cl. ..................... 361/93.9; 361/93.7
(58) Field of Classification Search ......... 361/93.7–93.9
See application file for complete search history.

(56) References Cited

U.S. PATENT DOCUMENTS

| 4,553,084 | A | 11/1985 | Wrathall |
| 7,636,227 | B2 * | 12/2009 | Cheng et al. ................. 361/93.1 |
| 2002/0118500 | A1 * | 8/2002 | Covi et al. ................... 361/93.1 |
| 2003/0072120 | A1 * | 4/2003 | Ishikawa et al. ............ 361/93.9 |

* cited by examiner

*Primary Examiner* — Danny Nguyen
(74) *Attorney, Agent, or Firm* — Slater & Matsil, L.L.P.

(57) ABSTRACT

A semiconductor device with an over-current detection feature is disclosed. According to an example of the invention the device includes: a semiconductor chip including a load current path that conducts a load current in response to an input signal activating the load current flow. A current sensor arrangement provides a measurement signal representing the load current. An evaluation circuit is configured to compare the measurement signal with a first threshold and to signal an over-current when the measurement signal exceeds the first threshold after a delay time period starting from the activation of the load current flow has elapsed.

12 Claims, 3 Drawing Sheets

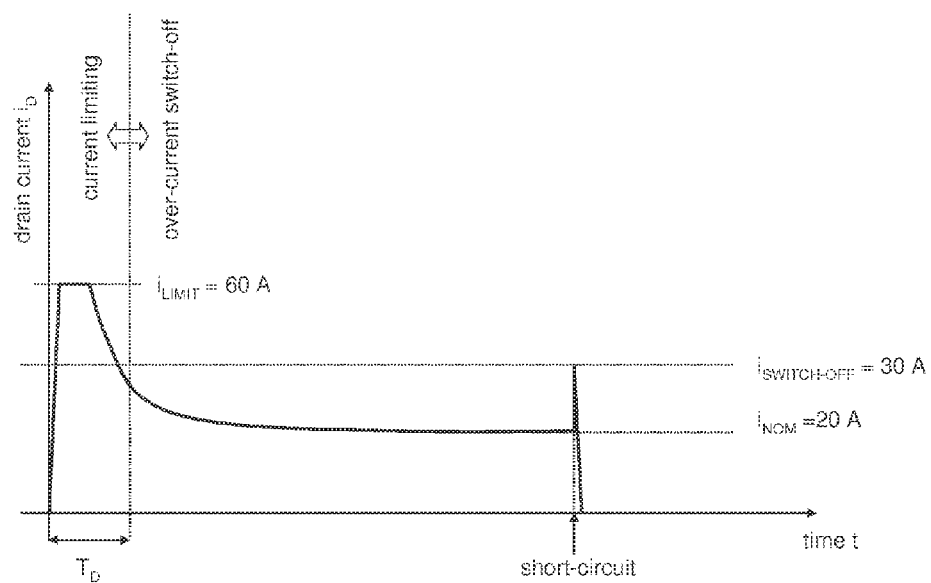
FIG. 5  short-circuit after switch-on
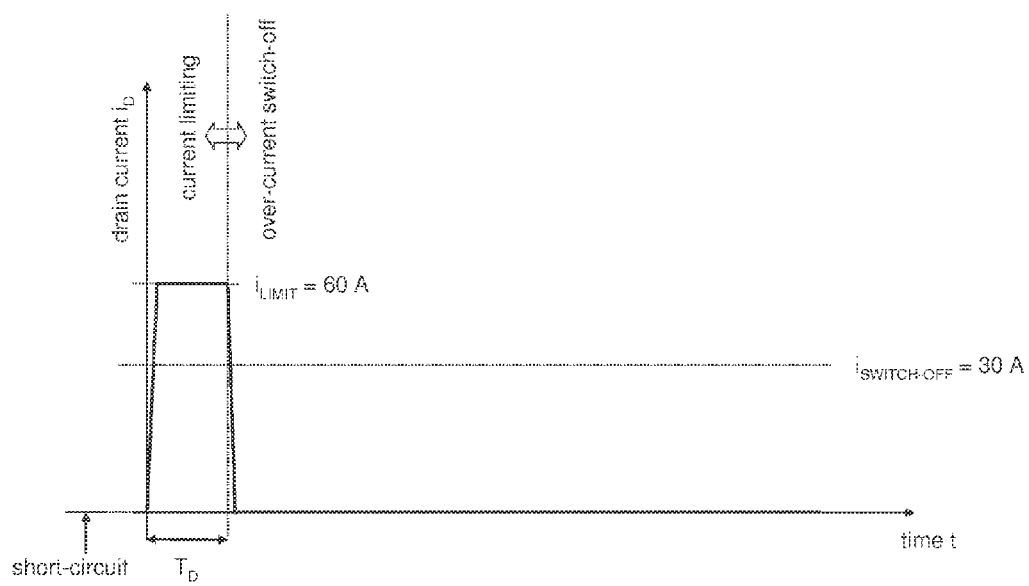
FIG. 6  short-circuit before switch-on

SEMICONDUCTOR DEVICE WITH OVERCURRENT PROTECTION

TECHNICAL FIELD

The present invention relates to the field of semiconductor devices and methods for operating such devices, especially to power semiconductor devices including a novel over-current protection.

BACKGROUND

Semiconductor devices, especially power semiconductor devices such as power semiconductor switches often include either a current limitation functionality or an over-current protection (i.e., an over-current switch-off) in order to avoid a thermal destruction of the device due to over-heating. In the first case the load current of the semiconductor device is limited to a predefined maximum value (e.g., 30 amperes) if the load resistance in the load current path is too low whereas in the latter case the semiconductor device (e.g., the power switch) is turned off if a predefined load current threshold (e.g., 60 amperes) is exceeded.

Both of the above mentioned principles (current limiting or over-current switch-off) have some implications and thus it depends on the application which one of the two protection principles is more suitable. If, for example, the load is a lamp, which has a high inrush current during a short start-up period, a current limitation to a predefined maximum current may be suitable. However, in case of a short circuit this predefined maximum current may be too high in order to avoid an over-heating of the device. To resolve this problem some semiconductor devices additionally include temperature sensors for triggering countermeasures in case of over-temperature. Such temperature sensors entail a more complex design of the device thus higher costs. If, instead of current limiting, an over-current protection (i.e., a shut-down in response to an over-current) is employed the current threshold would have to be that low in order to reliably avoid over-heating of the device that, as a consequence, the high inrush current (for example, during the start-up period of a lamp) would also trigger the over-current switch-off.

Summing up, it can be concluded that the protection circuits, irrespective of which one of the above-discussed protection principles is to be used, have to be either designed for a high inrush current or designed for a lower "nominal" current. To cope with both cases (start-up and normal operation) additional temperature sensors are needed. Thus, there is a general need for a semiconductor device including an inexpensive protection mechanism that provides sufficient protection against over-heating and thermal destruction during the start-up period of the device as well as during normal operation.

SUMMARY OF THE INVENTION

A semiconductor device with an over-current detection feature is disclosed. According to an example of the invention the device includes: a semiconductor chip including a load current path that conducts a load current in response to an input signal activating the load current flow. A current sensor arrangement provides a measurement signal representing the load current. An evaluation circuit is configured to compare the measurement signal with a first threshold and to signal an over-current when the measurement signal exceeds the first threshold after a delay time period starting from the activation of the load current flow has elapsed.

Further, a method for operating a semiconductor device so as to provide an over-current detection is disclosed. According to an example of the invention the method includes: activating the load current flow in response to an input signal. The load current is measured so as to provide a measurement signal representing the load current. The measurement signal is compared with a first threshold. An over-current is signalled when the measurement signal exceeds the first threshold after a delay time period starting from the activation of the load current flow has elapsed.

BRIEF DESCRIPTION OF THE DRAWINGS

The invention can be better understood with reference to the following drawings and description. The components in the figures are not necessarily to scale, instead emphasis being placed upon illustrating the principles of the invention. Moreover, in the figures, like reference numerals designate corresponding parts. In the drawings:

FIGS. 4-6 illustrate by means of timing diagrams the mode of action of the exemplary circuits of FIGS. 1 and 2.

DETAILED DESCRIPTION OF ILLUSTRATIVE EMBODIMENTS

Figure 1:
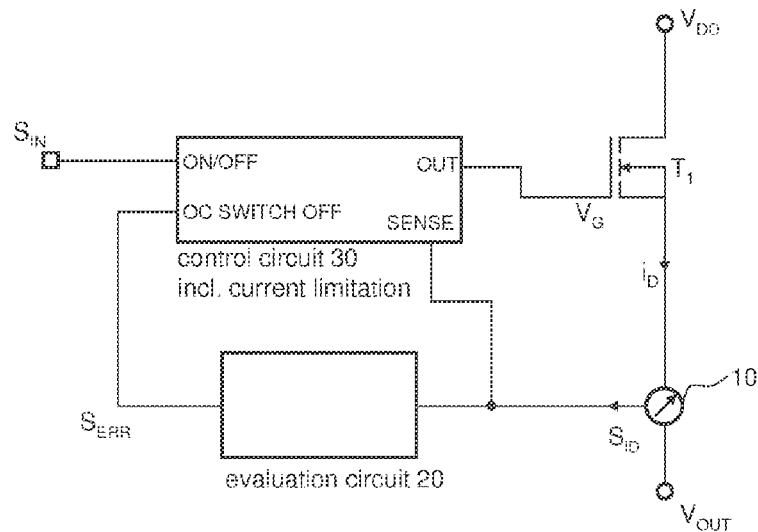
FIG. 1 illustrates one example of the present invention by means of a circuit diagram of a smart power switch including a novel protection against over-current and thermal destruction.

One example of the invention is illustrated in FIG. 1. Accordingly a semiconductor device includes a semiconductor chip with a load current path (current path between circuit nodes D and S) that conducts a load current $i_D$ in response to an input signal $S_{IN}$ activating the load current flow. The load current path may be, for example, the drain-source path of a MOS transistor $T_1$ (as is the case in the example of FIG. 1). However, the load current path may also be formed by the collector-emitter path of a bipolar transistor, the anode-cathode path of a thyristor or any other current path that can conduct a load current which—if too high—could thermally destroy the semiconductor device.

The semiconductor device illustrated in FIG. 1 further includes a current sensor arrangement 10 that provides a measurement signal $S_{iD}$ representing the load current $i_D$. Further, an evaluation circuit 20 is configured to provide a over-current and thus a short circuit detection. Accordingly, the evaluation circuit 20 is configured to compare the measurement signal $S_{iD}$ with a threshold $i_{SWITCH-OFF}$ and to signal an over-current (and, respectively, a short-circuit) by providing a respective error signal $S_{ERR}$ in case the measurement signal $S_{iD}$ exceeds (or still exceeds) the threshold $i_{SWITCH-OFF}$ after a delay time period $T_D$ has elapsed, wherein the delay time period $T_D$ starts at the activation of the load current flow. During the delay time period $T_D$ an over-current is not signalled even if the measurement signal $S_{iD}$ is above the threshold in order to allow high transient inrush currents. After activation of the load current flow. It should be noted, that the above-described function of the evaluation circuit can be implemented in various ways, whereby one exemplary implementation is discussed further below with reference to FIG. 3.

In one example of the invention the evaluation circuit 20 may be configured to trigger an over-current switch-off of the load current flow, e.g., via the error signal $S_{ERR}$, in case the measurement signal $S_{iD}$ exceeds the threshold $i_{SWITCH-OFF}$ after the delay time period $T_D$. In the example of FIG. 1 this over-current switch-off may be realized by setting a gate voltage $V_G$, which controls the conductance of the load current path of the semiconductor switch $T_1$, to a level appropriate for blocking the current flow through the semiconductor switch $T_1$.

The semiconductor device illustrated in FIG. 1 may further comprise a control circuit 30 that is configured to control the conductance of the load current path of the semiconductor switch $T_1$ by generating, for example, an appropriate gate voltage $V_G$ supplied to the semiconductor switch $T_1$. Accordingly, the load current flow is activated and deactivated in accordance with the input signal $S_{IN}$. Further, the control circuit 30 may be configured to limit the load current $i_D$ to a maximum current $i_{LIMIT}$. Thereby, the threshold $i_{SWITCH-OFF}$ may lower than the maximum current $i_{LIMIT}$. Thus, during the delay time period $T_D$ following the activation of the load current $i_D$ the load current is limited to a high maximum current value (e.g., to $i_{LIMIT}$=60 A) whereas, in contrast, after the delay time period $T_D$ has elapsed, the over-current detection or protection function provided by the evaluation circuit 20 is enabled, whereby the over-current threshold $i_{SWITCH-OFF}$ is lower (e.g., $i_{SWITCH-OFF}$=30 A) than the maximum current $i_{LIMIT}$. This entails that the current limiting capability of the control circuit 30 is not in use after the delay time period $T_D$ has elapsed (provided that, of course, the evaluation circuit has not been reset).

In order to ensure the over-current switch-off the control circuit may, according to one example of the invention, be configured to blank the input signal $S_{IN}$ in response to an over-current signal (e.g., error signal $S_{ERR}$) generated by the evaluation circuit 20 so as to deactivate the load current flow. This blanking function may be implemented with the help of a gate as will be discussed further below with respect to FIG. 2. Generally, apart from the blanking function any common gate driver circuit may be employed in the control circuit 30 for the purpose of driving the semiconductor switch.

An over-current switch off is typically the result of a short circuit of the load current path of the semiconductor device (e.g., of the semiconductor switch $T_1$ in the example of FIG. 1). In order to avoid an "automatic" reactivation of the load current flow after an over-current switch-off the evaluation circuit may be configured to maintain the over-current signal $S_{ERR}$ until a reset signal $S_{RES}$ signals to reset the over-current signal. The reset signal may be provided by an external controller. Alternatively, the input signal may be used as a reset signal, thereby resetting the evaluation circuit at each activation of the load current flow.

There are several options to react on an over-current switch off. Firstly, the circuit (e.g., the external controller) providing the reset signal may be configured to wait for a defined period of time before generating a reset signal for reactivating the semiconductor device. Secondly, the circuit providing the reset signal may be configured to wait until a measured temperature of the transistor (see DMOS $T_1$ in FIG. 1) decreases by a given value (e.g., 60K) or falls below a given threshold (e.g., 105° C.) before generating a reset signal for reactivating the semiconductor device. Further, the reset signal may be triggered by other events, such as the shutdown of all transistors in case of a multi-channel arrangement where several power transistors are operated and controlled in parallel. Finally, the reset signal may be provided by an external controller as mentioned above. The reset signal may be provided in various ways such as by a command given through a digital interface (e.g., SPI, LIN, CAN, µs-bus, etc.).

Figure 2:
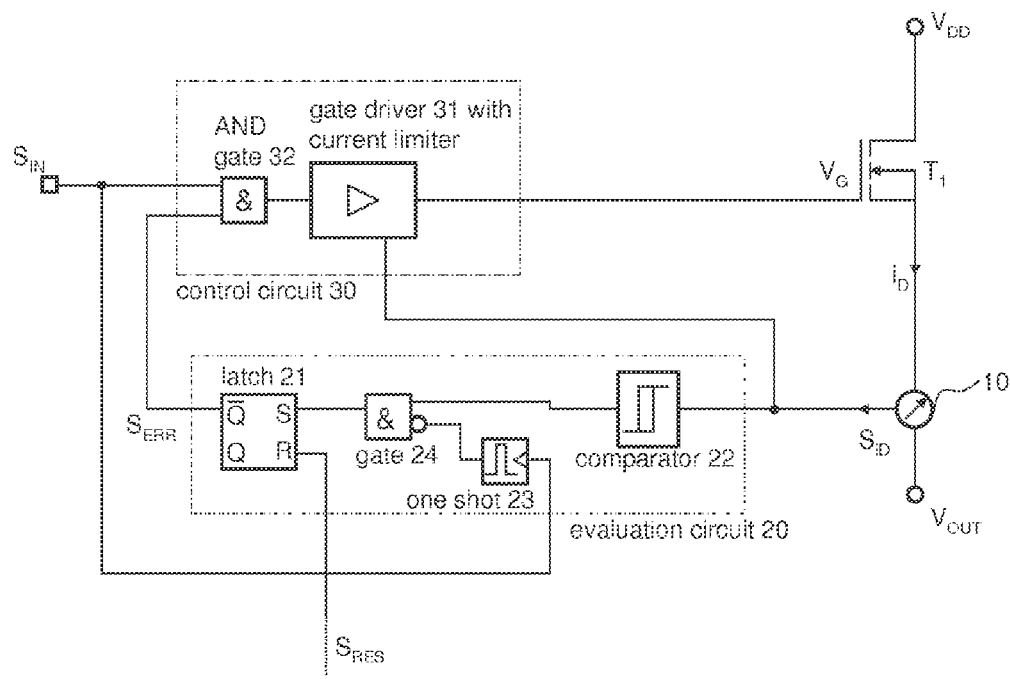
FIG. 2 illustrates in more detail one possible implementation of the example of FIG. 1.

FIG. 2 illustrates one example of an implementation of the basic circuit of FIG. 1. As the example of FIG. 1 the semiconductor device comprises a MOS transistor $T_1$ as power semiconductor switch. The transistor $T_1$ switches a load current $i_D$ off in accordance with a control signal $V_G$, which is the gate voltage in the present example. The transistor $T_1$ includes a drain-source current path (i.e., the load current path D-S) which takes over the load current while the transistor $T_1$ is switched on. The drain-source current path of the transistor $T_1$ is connected between a supply voltage node that provides a supply voltage $V_{DD}$ and an output node that supplies a load (e.g., a lamp or a DC motor) connected thereto (not shown) with the load current $i_D$ while the transistor $T_1$ is switched on. The voltage present at the output node with respect to a reference potential (e.g., ground GND, not shown) is denoted with $V_{OUT}$.

Further a current measurement arrangement 10 is coupled to the load current path for providing a measurement signal $S_{iD}$ that represents the load current $i_D$. There are many possibilities for measuring the load current $i_D$ such as, for example, the use of a shunt resistor or, alternatively, the use of a so-called sense transistor as, for example, described in U.S. Pat. No. 4,553,084.

The current measurement signal $S_{iD}$ is supplied to a gate circuit 31 included in the control circuit 30 and to the evaluation circuit 20. The gate circuit 31 generates the control signal $V_G$ (i.e., the gate voltage) for switching the transistor $T_1$ on and off in accordance with an input signal $S_{IN}$. In order to limit the gate current $i_D$ to a maximum current value $i_{LIMIT}$ (see also FIGS. 3 and 4), the gate driver 31 receives the measurement signal $S_{iD}$ as an input. The input signal $S_{IN}$, however, is supplied to the gate driver 31 via the AND gate 32, so as to provide the possibility to blank the input signal $S_{IN}$ in case the evaluation circuit 20 signals a short circuit. Therefore, the error signal $S_{ERR}$ generated by the evaluation circuit 20 is supplied to the AND gate 32 as an input signal. The output signal $S_{IN}'$ of the AND gate 32 follows the Boolean equation $S_{IN}'=S_{IN}$ AND $S_{ERR}$, whereby $S_{ERR}$ assumes a logic "0" value if a short-circuit or an over-current is detected and a logic "1" value if the load current has not left the allowable range defined by the threshold level $i_{SWITCH-OFF}$ during normal operation of the semiconductor device (i.e., after the transient inrush currents have decayed). Thus, during normal operation $S_{IN}'=S_{IN}$ as long as the load current $i_D$ stays below the threshold level $i_{SWITCH-OFF}$ and the AND gate 32 is "transparent".

The short-circuit and over-current detection function may be implemented by the evaluation circuit 20 of the present example. It receives the current measurement signal $S_{iD}$ and, as mentioned above, signals an error by setting the error signal $S_{ERR}$ to an appropriate logic level. Therefore, the evaluation circuit 20 may include a comparator 22 (with or without hysteresis) receiving the measurement signal $S_{iD}$ and providing a logic "1" level (i.e., a high level in the present example) at its output in case the drain current $i_D$ exceeds the threshold level $i_{SWITCH-OFF}$. However, in order to avoid an over-current switch off during a start-up period of transient high inrush currents the output signal of the comparator 22 by the AND gate 24, which is connected between the output of the comparator 22 and a set input of an RS-latch 21. Assuming the AND gate 24 does not blank the comparator output signal, the comparator sets the latch 21 when the load current $i_D$ exceeds the threshold level $i_{SWITCH-OFF}$. The inverted output of the latch 21 provides the error signal $S_{ERR}$ in the present example (i.e., $S_{ERR}$=0 if $i_D$ once exceeds $i_{SWITCH-OFF}$ after a reset of the latch).

The blanking of the output of the comparator 22 is, in the present example, realized by employing a monostable trigger circuit 23, also called "one shot", that, when triggered provides a single pulse of a predefined length. That pulse length is equal to the above-mentioned delay time period $T_D$ during which the over-current detection is "disabled" by blanking the comparator output signal. The monostable trigger circuit 23 is triggered essentially at the same time as the transistor $T_1$ is switched on (thereby neglecting propagation delays that always occur in logic circuits). The output pulse of the monostable trigger circuit 23 is supplied to an inverting input of the AND gate 24 to provide the above-described function of blanking the comparator output signal.

As a result the latch 21 is set when the load current exceeds the threshold $i_{SWITCH-OFF}$ after the delay time period $T_D$ has elapsed, whereby the delay time period $T_D$ starts when the transistor $T_1$ is activated (i.e., switched on). The delay time period $T_D$ may, dependent on the actual application, vary from a few milliseconds up to several seconds, e.g., from 300 ms to 5000 ms.

The over-current signal $S_{ERR}$ remains set (e.g., to $S_{ERR}=0$ in the present example) thus signalling an over-current until the latch 21 is reset. In the example of FIG. 2 the latch is reset by an appropriate logic level of a reset signal $S_{RES}$ which, for example, may be provided by an external controller (not shown) that sets as a "reset command" the signal $S_{RES}$ to a logic "0" level for a short defined time period. However, also the input signal $S_{IN}$ may be used to derive an appropriate reset signal. In the present example an inverted version of the input signal $S_{IN}$ may be used to reset the latch 21 so as to reset the latch 21 when the transistor $T_1$ is switched off. In this case the evaluation circuit 20 and thus the over-current detection is reset every switching cycle of the transistor $T_1$.

FIGS. 3 to 6 illustrate the function of the above-described examples of the invention with the help of timing diagrams illustrating the course of the load current over time in case of a lamp (or a set of lamps connected in parallel) used as load being switched on and off by the semiconductor switch $T_1$. In all examples discussed below the nominal current $i_{NOM}$ through the load is 20 A (e.g., an electric power 240 W at 12 V), whereby during a period of high inrush current after switching on the semiconductor switch $T_1$ the load current peak $I_{MAX}$ is 70 A if not applying any current limiting function. When employing, for example, a gate driver as shown in FIG. 2 the maximum current is limited to a maximum value $i_{LIMIT}$ of 60 A, whereas after the delay time period $T_D$ the threshold $i_{SWITCH-OFF}$ for an over-current detection is 35 A. It should be noted that the above-mentioned current values have to be regarded as examples that are chosen rather arbitrarily and that may vary in different applications.

Figure 3:
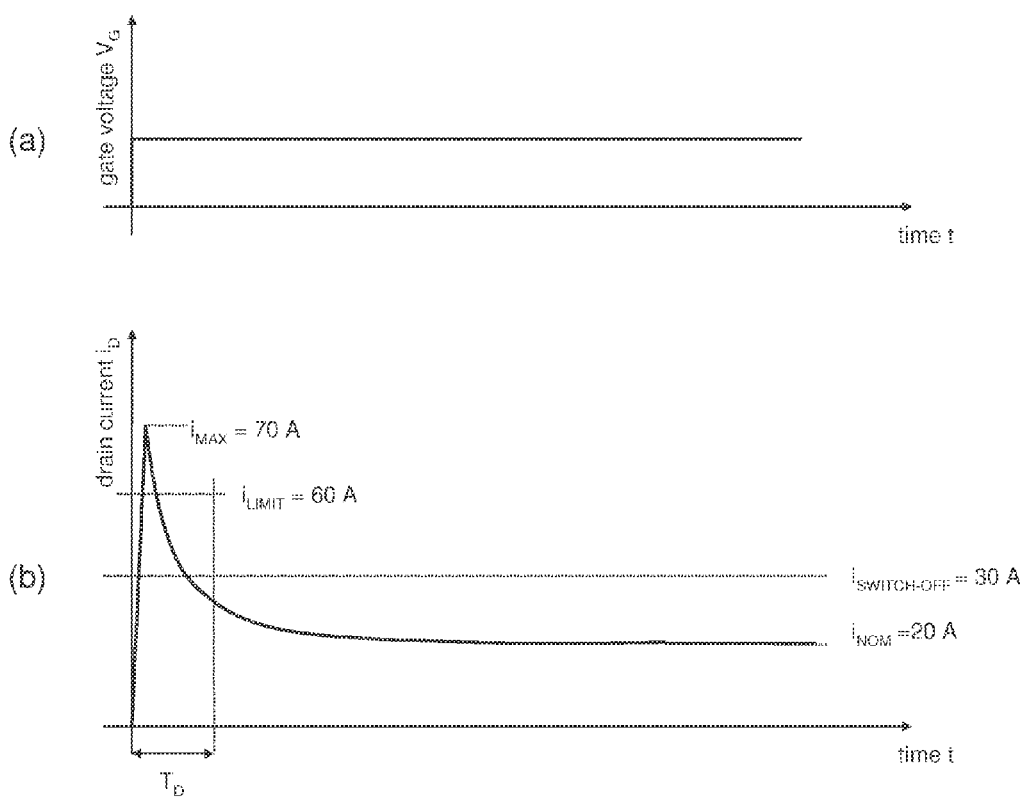
FIG. 3, consisting of FIGS. 3a and 3b, illustrates by means of timing diagrams the switch-on behavior of a temperature-dependent load such as a lamp.

FIG. 3 illustrates the course of the gate voltage $V_G$ (FIG. 3a) supplied to transistor $T_1$ and the corresponding drain current $i_D$ (FIG. 3b) without any current limiting function active. Assuming the gate voltage rises from zero to a level that is high enough to switch on the transistor $T_1$ at a time $t=0$ the load current $i_D$ also starts to rise immediately after switch-on of the transistor $T_1$ up to its peak value $i_D=i_{MAX}$. As the high inrush current decays (e.g., due to a rising load resistance resulting from the rising temperature in the lamp), the load current $i_D$ gradually drops down to the nominal value $i_D=i_{NOM}$ before the time period $T_D$ has elapsed. Since the load current $i_D$ remains below the threshold $i_{SWITCH-OFF}$ after the time $t=T_D$ no over-current is signaled.

Figure 4:
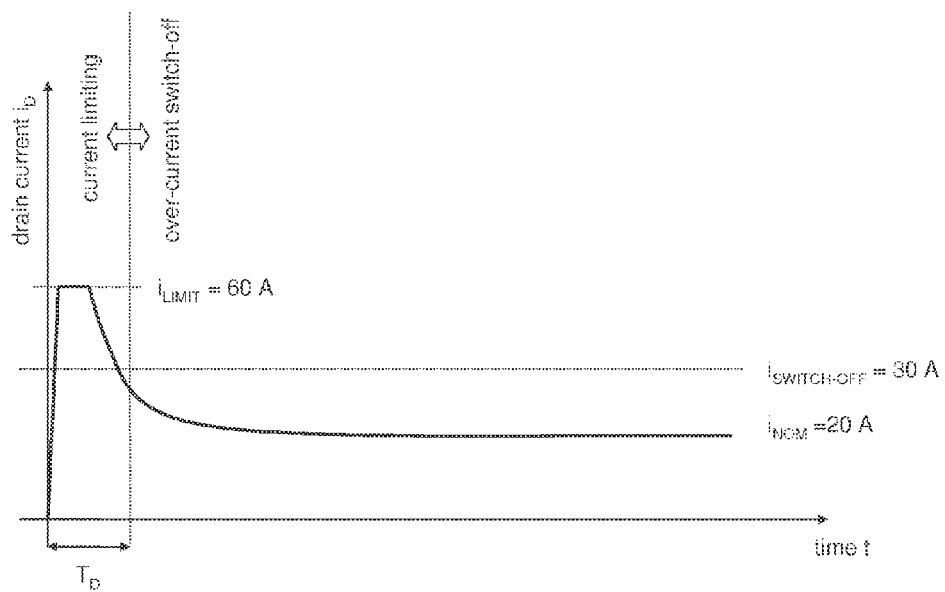

FIG. 4 illustrates the same situation as illustrated in FIG. 3b with an additional current limiting to the maximum current value $i_{LIMIT}$, which is below the peak current $i_{MAX}$ of FIG. 3b. The peak current is limited to a value of $i_{LIMIT}$ and it takes a little longer until the load current drops to the nominal value. However, the load current $i_D$ falls below the threshold $i_{SWITCH-OFF}$ before the delay time period $T_D$ has elapsed and thus, too, no over-current is signaled in the present example.

FIG. 5 illustrates the same situation as illustrated in FIG. 4 but with a short circuit occurring in the load during normal operation (after $t=T_D$). As a consequence of the short circuit, the load current $i_D$ rises immediately above the threshold $i_{SWITCH-OFF}$ and thus triggers the over-current switch-off as explained with reference to FIGS. 1 and 2.

FIG. 6 illustrates a similar situation as in FIG. 5. In this example, however, the short circuit occurs before the switch-on of the transistor $T_1$ (i.e., at a time $t<0$). As a consequence of the short circuit, the load current $i_D$ rises quickly and the current clips due to the current limitation directly after the switch-on of the transistor $T_1$. The load current $i_D$ remains at the maximum value $i_{LIMIT}$ and after the delay time period $T_D$ has elapsed, the over-current switch-off is immediately triggered since the maximum value $i_{LIMIT}$ of the current limiting function is above the threshold $i_{SWITCH-OFF}$ of the over-current detection.

Although the present invention and its advantages have been described in detail, it should be understood that various changes, substitutions, and alterations can be made herein without departing from the spirit and scope of the invention as defined by the appended claims. For example, it will be readily understood by those skilled in the art that the voltages and their polarities may be altered while remaining within the scope of the present invention.

Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
    a semiconductor chip including a load current path that conducts a load current in response to an input signal activating a load current flow;
    a current sensor arrangement that provides a measurement signal representing the load current;
    an evaluation circuit that is configured to compare the measurement signal with a first threshold and to signal an over-current when the measurement signal exceeds the first threshold after a delay time period that starts from the activation of the load current flow; and
    a control circuit configured to
    activate and deactivate the load current flow in accordance with the input signal,
    limit the load current to a maximum current value, and
    blank the input signal in response to an over-current signal generated by the evaluation circuit so as to deactivate the load current flow.

2. The semiconductor device of claim 1, wherein the evaluation circuit is configured to trigger an over-current switch-off of the load current flow when the measurement signal exceeds the first threshold after the delay time period.

3. The semiconductor device of claim 1, wherein the first threshold is lower than the maximum current value.

4. The semiconductor device of claim 1, wherein the evaluation circuit is configured to maintain the over-current signal until a reset signal signals to reset the over-current signal.

5. The semiconductor device of claim 4, wherein the reset signal is generated by an external controller.

6. The semiconductor device of claim 4, wherein the input signal that activates the load current flow is used as the reset signal.

7. The semiconductor device of claim 1, wherein the evaluation circuit comprises a latch that is configured to store an occurrence of exceeding the first threshold by the load current and correspondingly to signal an over-current until the latch is reset in response to an appropriate reset signal.

8. The semiconductor device of claim 1, further comprising a power semiconductor switch conducting the load current.

9. A method for operating a semiconductor device that comprises a semiconductor chip including a load current path for conducting a load current, the method comprising:
   activating a load current flow in the load current path in response to an input signal;
   measuring the load current so as to provide a measurement signal representing the load current;
   comparing the measurement signal with a first threshold;
   signalling an over-current when the measurement signal exceeds the first threshold after a delay time period that starts from the activation of the load current flow;
   limiting the load current to a maximum current value, wherein the first threshold is lower than the maximum current value; and
   blanking the input signal in response to an over-current signal thus deactivating the load current flow.

10. The method of claim 9, further comprising triggering an over-current switch-off of the load current flow when the measurement signal exceeds the first threshold after the delay time period.

11. The method of claim 9, further comprising receiving a reset signal; and
   maintaining the over-current signal until a reset command is identified in the reset signal.

12. The method of claim 11, wherein the input signal activating the load current flow is used as the reset signal.

* * * * *